(12) United States Patent
Park et al.

(10) Patent No.: US 12,108,587 B2
(45) Date of Patent: Oct. 1, 2024

(54) SEMICONDUCTOR DEVICE AND METHOD OF FORMING SAME

(71) Applicant: CHANGXIN MEMORY TECHNOLOGIES, INC., Hefei (CN)

(72) Inventors: Soon Byung Park, Hefei (CN); Er Xuan Ping, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 471 days.

(21) Appl. No.: 17/594,492

(22) PCT Filed: May 8, 2021

(86) PCT No.: PCT/CN2021/092284
§ 371 (c)(1),
(2) Date: Oct. 19, 2021

(87) PCT Pub. No.: WO2021/233138
PCT Pub. Date: Nov. 25, 2021

(65) Prior Publication Data
US 2022/0406787 A1    Dec. 22, 2022

(30) Foreign Application Priority Data
May 21, 2020    (CN) .......................... 202010434420.6

(51) Int. Cl.
*H10B 12/00*    (2023.01)
(52) U.S. Cl.
CPC ........... *H10B 12/053* (2023.02); *H10B 12/34* (2023.02)
(58) Field of Classification Search
None
See application file for complete search history.

(56) References Cited

U.S. PATENT DOCUMENTS 8,673,707 B2    3/2014    He et al.
9,064,956 B2    6/2015    Oh
(Continued)

FOREIGN PATENT DOCUMENTS

CN    101944531 A    1/2011
CN    102569050 A    7/2012
(Continued)

OTHER PUBLICATIONS

Written Opinion cited in PCT/CN2021/092284, mailed on Jul. 27, 2021, 7 pages.
(Continued)

*Primary Examiner* — Hsien Ming Lee
(74) *Attorney, Agent, or Firm* — Kilpatrick Townsend & Stockton LLP

(57) ABSTRACT

The present invention relates to the field of semiconductor manufacturing technologies, in particular to a semiconductor device and a method of forming the same. The method of forming the semiconductor device includes the following steps: forming a substrate with a trench, a gate dielectric layer covering an inner wall of the trench, a barrier layer covering a portion of a surface of the gate dielectric layer, and a first gate layer filled on an surface of the barrier layer being disposed in the trench; removing a portion of the barrier layer to form an groove located between the first gate layer and the gate dielectric layer; forming a channel dielectric layer at least covering an inner wall of the groove and a top surface of the first gate layer; and forming a second gate layer at least partially filling an interior of the groove.

18 Claims, 6 Drawing Sheets

(56) References Cited

U.S. PATENT DOCUMENTS

| | | | |
|---|---|---|---|
| 2005/0056887 A1 | 3/2005 | Tran | |
| 2010/0327337 A1 | 12/2010 | Yang | |
| 2012/0168859 A1* | 7/2012 | Jin | ........................ H01L 29/407 |
| | | | 438/270 |
| 2014/0063934 A1* | 3/2014 | Oh | ........................ H10B 12/34 |
| | | | 365/182 |
| 2014/0291754 A1 | 10/2014 | Lee et al. | |
| 2015/0340453 A1 | 11/2015 | Cho | |
| 2019/0259839 A1 | 8/2019 | Ryu | |
| 2020/0058744 A1* | 2/2020 | Wang | ................ H01L 29/41791 |

FOREIGN PATENT DOCUMENTS

| | | |
|---|---|---|
| CN | 103681804 A | 3/2014 |
| CN | 108346666 A | 7/2018 |
| CN | 109524399 A | 3/2019 |
| CN | 110034182 A | 7/2019 |
| CN | 110896077 A | 3/2020 |

OTHER PUBLICATIONS

First Office Action cited in CN202010434420.6, issued on Apr. 15, 2022, 17 pages.

Notice of Allowance cited in CN202010434420.6, issued on Dec. 12, 2022, 4 pages.

International Search Report as cited in PCT Application No. PCT/CN2021/092284 mailed Jul. 27, 2021, 4 pages.

\* cited by examiner

SEMICONDUCTOR DEVICE AND METHOD OF FORMING SAME

DESCRIPTION OF REFERENCE TO RELATED APPLICATIONS

The present application claims the priority of Chinese patent application having application No. 202010434420.6, entitled "SEMICONDUCTOR DEVICE AND METHOD OF FORMING SAME" and filed on 21 May 2020, the disclosure of which is accompanied in its entirety by reference herein.

FILED OF THE INVENTION

The present invention relates to the field of semiconductor manufacturing technologies, in particular to a semiconductor device and a method of forming the same.

BACKGROUND OF THE INVENTION

A Dynamic Random Access Memory (DRAM), which is a semiconductor device commonly used in an electronic device, such as a computer, consists of a plurality of memory cells. Each of the memory cells typically includes a transistor and a capacitor. The gate of the transistor is electrically connected to a wordline, the source of the transistor is electrically connected to a bitline, and the drain of the transistor is electrically connected to the capacitor. A wordline voltage over the wordline can control ON/OFF of the transistor, and then data information stored in the capacitor can be read through the bitline, or data information can be written through the bitline to the capacitor.

In order to improve a yield of DRAMs while realizing a high density memory of the DRAM, a primary technique employed is to reduce a pattern size in the DRAM. On such a basis, an embedded gate has become a predominate development trend. However, the embedded gate is prone to an effect of Gate-Induced Drain Leakage (GIDL). In order to solve this problem, a primary approach employed is to dispose, in a gate trench for forming the embedded gate, a first gate and a second gate located on the first gate, and use the second gate to reduce the GIDL effect. However, a formation of the second gate is likely to damage a portion of a gate dielectric layer located on side walls of the gate trench and a first gate layer, and thus, cause the portion of the gate dielectric layer to be thinner; these would result in an enhanced electric field, a challenge in guaranteeing a GIDL reduction effect, and a problem of an increased resistance of the embedded gate, thereby affecting an electrical performance of the DRAM.

Therefore, a technical problem currently requiring a prompt solution is how to decrease the resistance of the embedded gate while reducing the GIDL effect, thereby improving the electrical performance of the DRAM.

SUMMARY OF THE INVENTION

The present invention provides a semiconductor device and a method of forming the same to solve a problem of a likely increased resistance of an embedded gate while reducing a GIDL effect, thereby improving an electrical performance of a DRAM.

In order to solve the problem above, the present invention provides a method of forming a semiconductor device, including the following steps:

forming a substrate with a trench, a gate dielectric layer covering an inner wall of the trench, a barrier layer covering a portion of a surface of the gate dielectric layer, and a first gate layer filled on an inner side of the barrier layer being disposed in the trench;

removing a portion of the barrier layer to form a groove located between the first gate layer and the gate dielectric layer;

forming a channel dielectric layer at least covering an inner wall of the groove and a top surface of the first gate layer; and forming a second gate layer at least partially filling an interior of the groove.

In order to solve the problem described above, the present invention further provides a semiconductor device, including:

a substrate with a trench, an inner wall surface of the trench being covered with a gate dielectric layer;

a barrier layer covering a portion of a surface of the gate dielectric layer, a top surface of the barrier layer being located below a top surface of the gate dielectric layer;

a first gate layer filled on an inner side of the barrier layer, a top surface of the first gate layer being located below the top surface of the gate dielectric layer and above the top surface of the barrier layer;

a groove located between the first gate layer and the gate dielectric layer;

a channel dielectric layer at least covering an inner wall of the groove and the top surface of the first gate layer; and a second gate layer at least partially filling an interior of the groove.

DETAILED DESCRIPTION OF THE EMBODIMENTS

Embodiments of a semiconductor device and a method of forming the same according to the present invention are detailed below in combination with the accompanying drawings.

Figure 1:
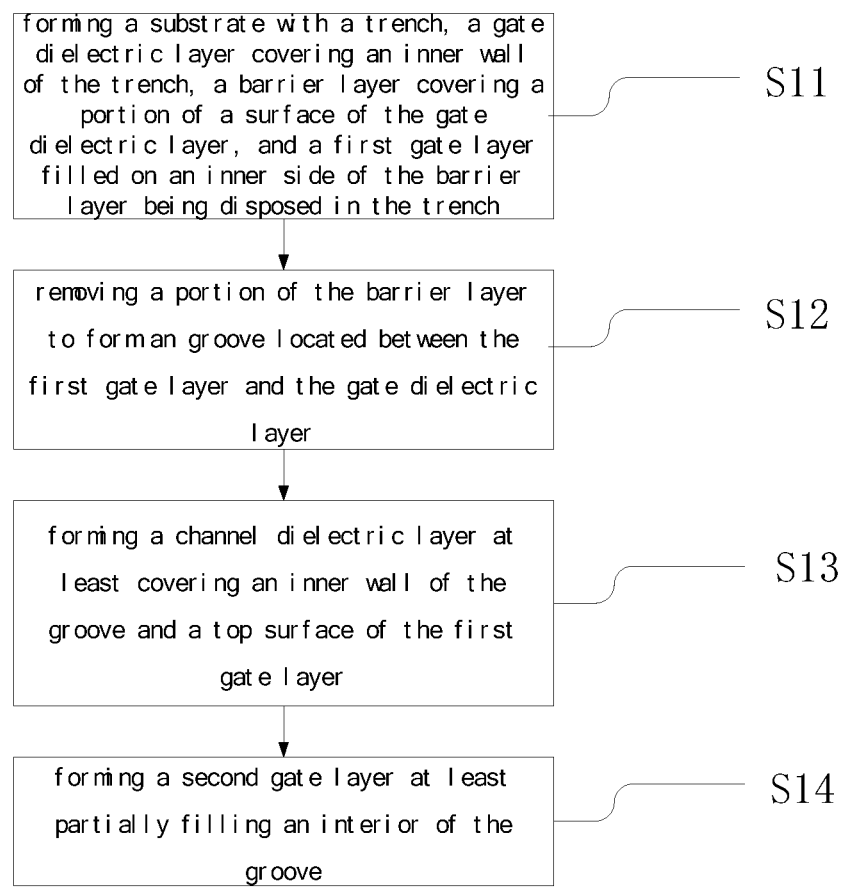
FIG. 1 is a flow diagram of a method of forming a semiconductor device according to an embodiment of the present invention.

In the embodiments, a method of forming a semiconductor device is provided. FIG. 1 is a flow diagram of a method of forming a semiconductor device according to an embodiment of the present invention, and FIGS. 2A to 2I are schematic cross-sectional diagrams of primary processes in a course of forming a semiconductor device according to an embodiment of the present invention. A semiconductor device described in the embodiments may be, but not limited to, a DRAM device. As show in FIG. 1 and FIGS. 2A to 2I, the method of forming the semiconductor device according to the embodiment includes the following steps.

Step S11: forming a substrate 10 with a trench 20; a gate dielectric layer 21 covering an inner wall of the trench 20, a barrier layer 22 covering a portion of a surface of the gate dielectric layer 21, and a first gate layer 23 filled on an inner side of the barrier layer 22 are disposed in the trench.

Optionally, specific steps of forming the substrate 10 includes:

providing the substrate 10 with the trench 20;

successively forming the gate dielectric layer 21 covering an entire inner wall of the trench 20, the barrier layer 22 covering an entire surface of the gate dielectric layer 21, and the first gate layer 23 filled on an overall inner side of the barrier layer 22; and back etching the barrier layer 22 and the first gate layer 23, such that both of a top surface of the barrier layer 22 and a top surface of the first gate layer 23 are located below a top surface of the trench 20.

Specifically, the substrate 10 may be etched by using a dry etching process or a wet etching process, so as to form the trench 20 extending to an interior of the substrate 10 along a direction perpendicular to a direction of the substrate 10. The trench 20 has a junction region on each of its opposite sides. The junction regions may serve as a bitline node contact region 24 and a memory node contact region 25 respectively. Then, the gate dielectric layer 21 is formed covering the entire side walls and bottom wall of the trench 20. A material of the gate dielectric layer 21 may be an oxide, such as a silicon dioxide. Next, the barrier layer 22 is deposited on an entire surface of the gate dielectric layer 21, and the first gate layer 23 is filled in the trench 20, such that the first gate layer 23 covers a surface of the barrier layer 22. Afterwards, the barrier layer 22 and the first gate layer 23 are back etched, such that both of a top surface of the residual barrier layer 22 in the trench 20 and a top surface of the residual first gate layer 23 in the trench 20 are located below a top surface of the trench 20. After this back-etch, the top surface of the residual barrier layer 22 may flush with the top surface of the residual first gate layer 23. A material of the barrier layer 22 may be titanium nitride, and a material of the first gate layer 23 may be low-resistance metals, such as tungsten, molybdenum, or the like.

Figure 2A:
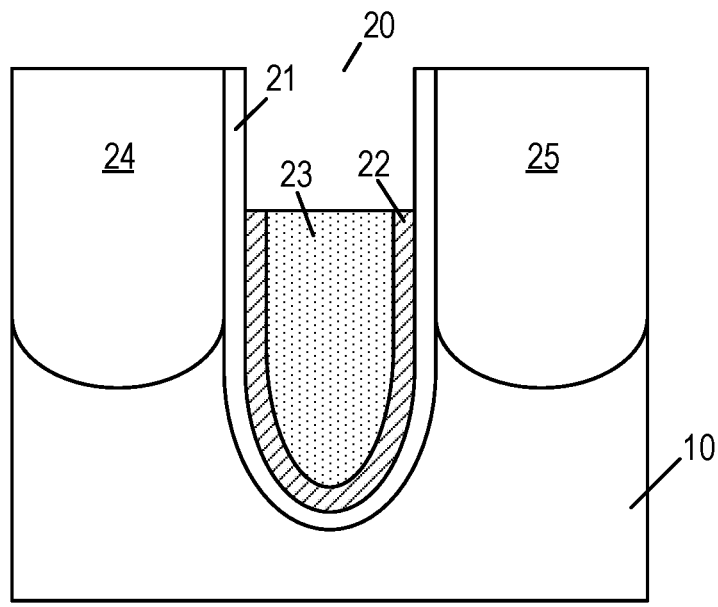
FIGS. 2A to 2I are schematic cross-sectional diagrams of primary processes in a course of forming a semiconductor device according to an embodiment of the present invention.
Figure 2B:
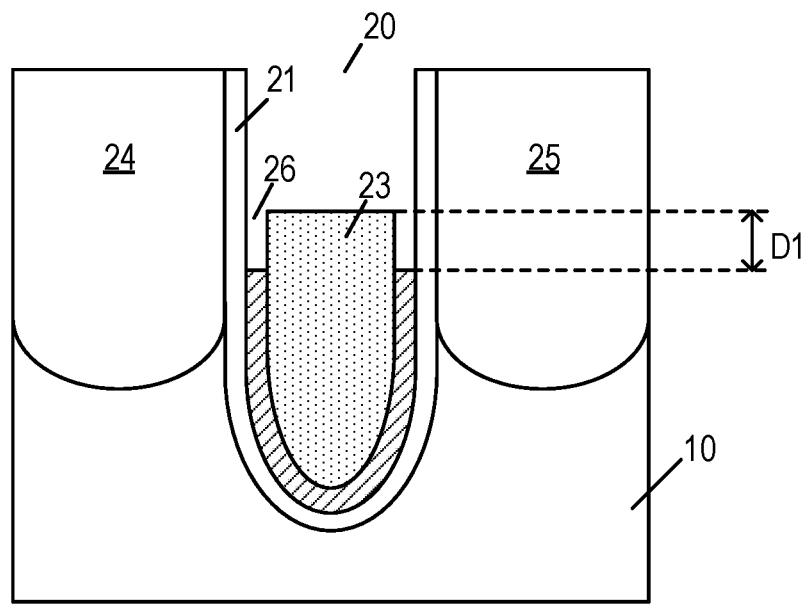

Step S12: removing a portion of the barrier layer 22 to form a groove 26 located between the first gate layer 23 and the gate dielectric layer 21, as show in FIG. 2B.

Optionally, specific steps of removing a portion of the barrier layer 22 includes:

etching a portion of the barrier layer 22 by an in-situ process or an ex-situ process.

Specifically, by etching a portion of the barrier layer 22 by an in-situ process or an ex-situ process, the barrier layer 22 has an reduction in height, such that the top surface of the residual barrier layer 22 after being etched is located below the top surface of the first gate layer 23, thereby forming between the first gate layer 23 and the gate dielectric layer 21 a gap region, namely the groove 26. Since the groove 26 is formed by etching the portion of the barrier layer 22, which barely causes any damage to the first gate layer 23, thereby minimizing a degree of a recess caused to the first gate layer 23, reducing and even avoiding a significant increase of a resistance in the first gate layer 23.

A depth D1 of the groove 26 may be selected by the person skilled in the art as needed. In the embodiments, a bottom surface of the groove 26 may be arranged above a bottom surface of the bitline node contact region 24 and a bottom surface of the memory node contact region 25 to further reduce an influence of the GILD effect.

Figure 2C:
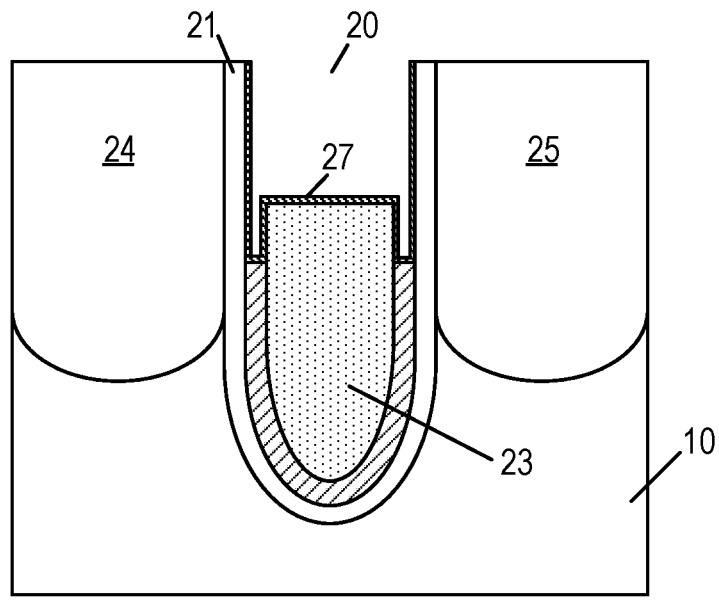

Step S13: forming a channel dielectric layer 27 at least covering an inner wall of the groove 26 and a top surface of the first gate layer 23, as shown in FIG. 2C.

Optionally, specific steps of forming the channel dielectric layer 27 at least covering the inner wall of the groove 26 and the top surface of the first gate layer 23 includes:

depositing, by an atomic layer deposition process, the channel dielectric layer 27 covering the inner wall of the groove 26, the top surface of the first gate layer 23, and a surface of the gate dielectric layer 21. The channel dielectric layer 27 may be formed in a manner of an atomic layer deposition of only oxide, or in a manner of an atomic layer deposition of oxide and nitride. After the channel dielectric layer 27 is formed, the gate dielectric layer 21 located on the side walls of the groove 26 and the surface of the gate dielectric layer 21 are covered with a thickness formed by the channel dielectric layer 27, which may be greater than or equal to a thickness of the gate dielectric layer 21 contacting the barrier layer 22.

Specifically, after the groove 26 is formed, the channel dielectric layer 27 is deposited in the trench 20 by an atomic layer deposition process. The channel dielectric layer 27 continuously covers the entire exposed surface of the gate dielectric layer 21, the entire inner wall of the groove 26 and the entire top surface of the first gate layer 23. On one hand, the formation of the channel dielectric layer 27 is a supplementary to the thickness of the gate dielectric layer 21 on the side walls of the groove 26, avoiding a phenomenon of an electric field enhancement caused by an excessively thin gate dielectric layer 21; on the other hand, the channel dielectric layer can also serve as a tunneling layer to maintain gate characteristics of the embedded transistor, and a tunneling current in the channel dielectric layer 27 can ensure an electrical connection between the first gate layer 23 and a second gate layer formed subsequently, and can reduce a contact resistance between the first gate layer 23 and the second gate layer.

In the embodiments, an example of the channel dielectric layer 27 covering the entire exposed gate dielectric layer 21, the entire inner wall of the groove 26 and the entire top surface of the first gate layer 23 is taken for illustration. This may also be arranged by the person skilled in the art as needed, and may also be arranged such that the channel dielectric layer 27 only covers the entire inner wall of the groove 26 and the entire top surface of the first gate layer 23, and the surface of the gate dielectric layer 21 located outside of the groove 26 is not covered by the channel dielectric layer 27.

Optionally, a material of the channel dielectric layer 27 is one or a combination of an oxide and a nitride.

In the embodiments, the channel dielectric layer 27 may be a single layer structure made of an oxide or a nitride, and may also be a laminated structure made of an oxide and a nitride, the person skilled in the art may select as needed. Regardless of the single layer structure or the laminated structure, forming the channel dielectric layer 27 by the atomic layer deposition process is helpful to increase a compactness of the channel dielectric layer 27.

Optionally, the channel dielectric layer 27 has a thickness less than the barrier layer 22.

Optionally, the channel dielectric layer 27 has a thickness of 1 Å to 20 Å, for example, 1 Å, 5 Å, 10 Å, 15 Å, or 20 Å.

Figure 2D:
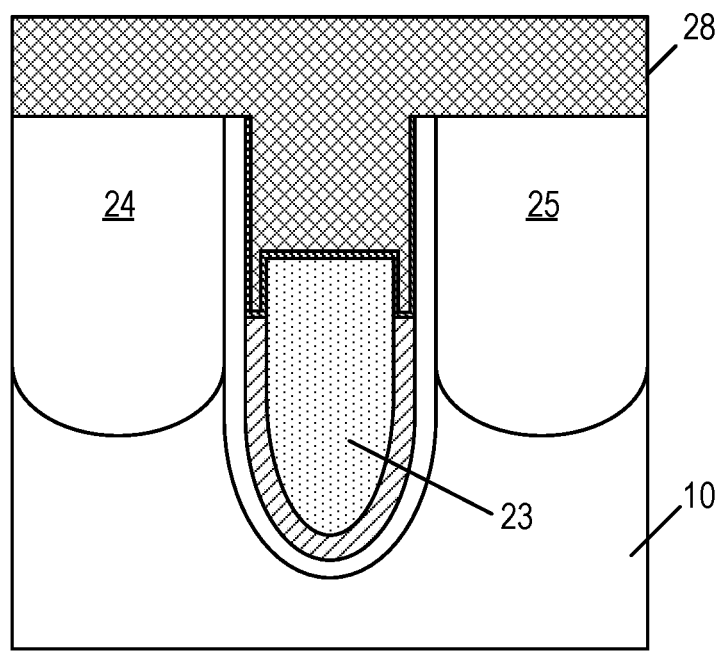
Figure 2E:
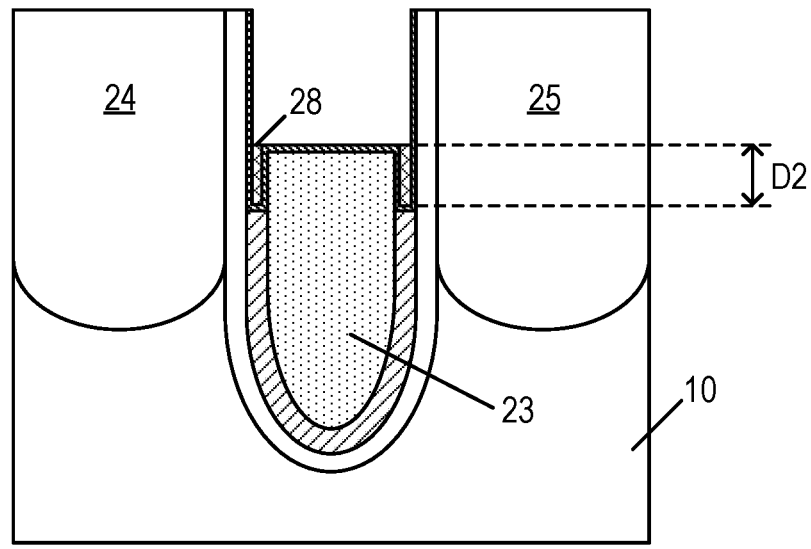

Step S14: forming a second gate layer 28 at least partially filling an interior of the groove 26, as shown in FIG. 2E.

Specifically, the channel dielectric layer 27 covers the inner wall of the groove 26, and does not fill the groove 26. After the channel dielectric layer 27 is formed, the second gate layer 28 is filled in the trench 20, as shown in FIG. 2D. Then, the second gate layer 28 is back etched, such that the interior of the groove 26 is filled with the residual second gate layer 28 at least partially, as shown in FIG. 2E. A material of the second gate layer 28 may be same as a material of the first gate layer 23, both of which are metal or polycrystalline silicon, for example. Alternatively, the material of the second gate layer 28 may be different from the material of the first gate layer 23. For example, the material of the first gate layer 23 may be low-resistance metals, such as tungsten, molybdenum, or the like, and the material of the second gate layer 28 is polycrystalline silicon.

Figure 2F:
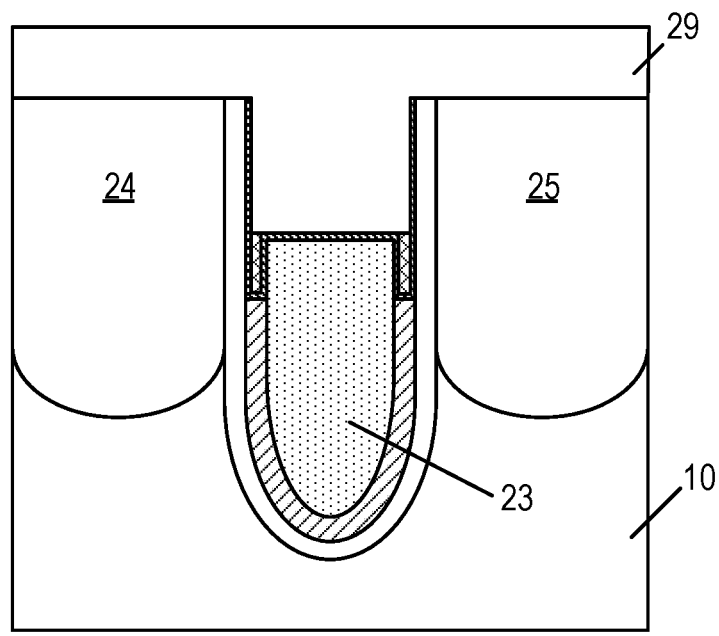
Figure 2G:
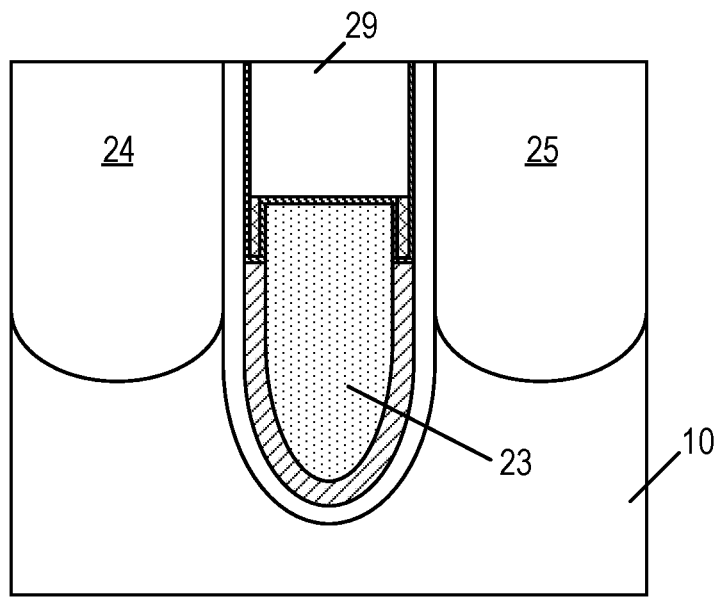
Figure 2H:
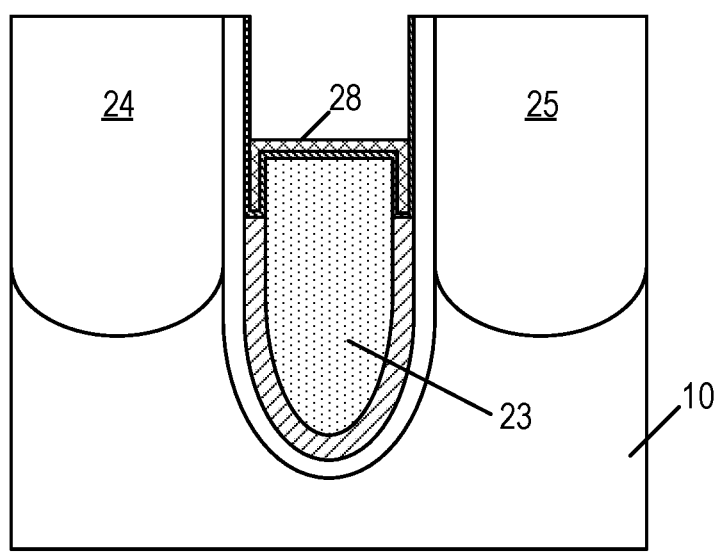
Figure 2I:
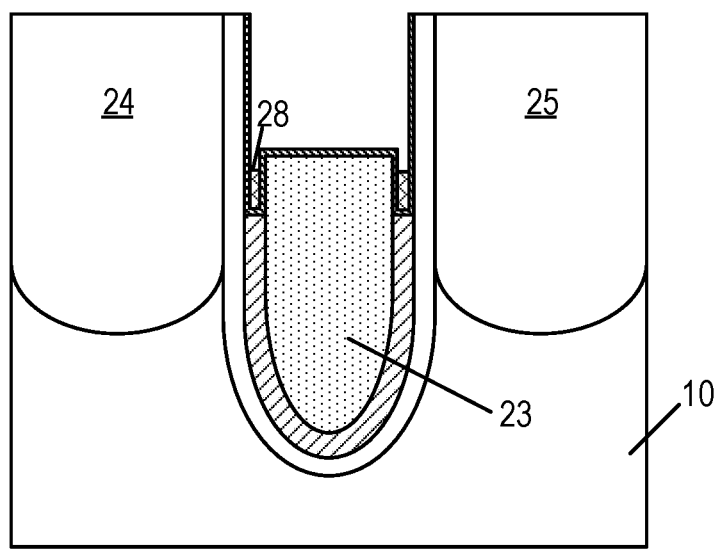

Optionally, the second gate layer 28 is located only in the groove 26, and a top surface of the second gate layer 28 is located below the top surface of the first gate layer 23, as shown in FIG. 2I; or the second gate layer 28 is located only in the groove 26, and the top surface of the second gate layer 28 flushes with the top surface of the first gate layer 23, as shown in FIG. 2E; or the groove 26 is filled with the second gate layer 28 and a surface of the channel dielectric layer 27 located on the top surface of the first gate layer 23 is covered with the second gate layer 28, as shown in FIG. 2H.

Specifically, the top surface of the second gate layer 28 covering the surface of the channel dielectric layer 27 may be located below, flush with, or above the top surface of the first gate layer 23. The person skilled in the art may set a specific value for the thickness D2 of the second gate layer 28 as needed, such as according to a physical distance between the second gate layer 28 and the memory node contact region 25 (e.g., the leakage path between the second gate layer 28 and the memory node contact region 25), a received amount of GIDL leakage, or other factors. In the embodiments, the thickness D2 of the second gate layer 28 refers to a distance from a bottom surface of the second gate layer 28 to a top surface of the second gate layer 28, the bottom surface of the second gate layer 28 refers to the surface of the second gate layer 28 which contacts the channel dielectric layer 27 covering on the bottom surface of the groove 26.

Optionally, after the second gate layer 28 at least partially filling the interior of the groove 26 is formed, the method further includes the following step:

forming a gate overlying layer 29 filling the trench 20, as shown in FIG. 2G.

Specifically, after the second gate layer 28 is formed, materials such as silicon nitride is filled in the trench 20 to form the gate overlying layer 29, as show in FIG. 2F; then, the gate overlying layer 29 is back etched to remove the gate overlying layer outside of the trench 20 to obtain a structure as shown in FIG. 2G. In the case where the second gate layer 28 is located only in the groove 26, and the top surface of the second gate layer 28 is located below the top surface of the first gate layer 23, the interior of the trench 20 is filled with the gate overlying layer 29 and the surface of the second gate layer 28 and the surface of the channel dielectric layer 27 are covered with the gate overlying layer 29. In the case where the second gate layer 28 is located only in the groove 26, and the top surface of the second gate layer 28 flushes with the top surface of the first gate layer 23, the interior of the trench 20 is filled with the gate overlying layer 29 and the surface of the second gate layer 28 and the surface of the channel dielectric layer 27 is covered with the gate overlying layer 29. In the case where the groove 26 is filled with the second gate layer 28 and the surface of the channel dielectric layer 27 located on the top surface of the first gate layer 23 is covered with the second gate layer 28, the gate overlying layer 29 covers and fills the interior of the trench 20 and covers the surface of the second gate layer 28.

Besides, the embodiment further provides a semiconductor device. The semiconductor device according to the embodiment may be formed by using the method as illustrated in FIG. 1, and FIGS. 2A to 2I, the structures of the formed semiconductor device can be seen in FIG. 2E, FIGS. 2G to 2I. A semiconductor device described in the embodiments may be, but not limited to, a DRAM device. As shown in FIGS. 2A to 2I, the semiconductor device includes:

a substrate 10 with a trench 20, an inner wall surface of the trench 20 being covered with a gate dielectric layer 21;

a barrier layer 22 covering a portion of a surface of the gate dielectric layer 21, a top surface of the barrier layer 22 being located below a top surface of the gate dielectric layer 21;

a first gate layer 23 filled on an inner side of the barrier layer 22, a top surface of the first gate layer 23 being located below the top surface of the gate dielectric layer 21 and above the top surface of the barrier layer 22;

a groove 26 located between the first gate layer 23 and the gate dielectric layer 21;

a channel dielectric layer 27 at least covering an inner wall of the groove 26 and the top surface of the first gate layer 23; and a second gate layer 28 at least partially filling an interior of the groove 26.

Optionally, the channel dielectric layer 27 has a thickness less than the barrier layer 22.

Optionally, the channel dielectric layer 27 has a thickness of 1 Å to 20 Å.

Optionally, the second gate layer 28 is located only in the groove 26, and a top surface of the second gate layer 28 is located below the top surface of the first gate layer 23; or the second gate layer 28 is located only in the groove 26, and the top surface of the second gate layer 28 flushes with the top surface of the first gate layer 23; or the groove 26 is filled with the second gate layer 28 and a surface of the channel dielectric layer 27 located on the top surface of the first gate layer 23 is covered with the second gate layer 28.

Optionally, the substrate 10 further includes a memory node contact region 25 and a bitline node contact region 24, which are located on opposite sides of the trench 20;

a bottom surface of the groove 26 is located above a bottom surface of the memory node contact region 25 and a bottom surface of the bitline node contact region 24.

Optionally, a material of the first gate layer 23 is metal, and a material of the second gate layer 28 is polycrystalline silicon.

Optionally, a material of the channel dielectric layer 27 is one or a combination of an oxide and a nitride.

Optionally, the semiconductor device further includes:

a gate overlying layer located on the second gate layer 28 and/or the channel dielectric layer 27.

The semiconductor device and the method of forming the same according to the embodiments remove a portion of a barrier layer to form a groove between a first gate layer and a gate dielectric layer, enabling a formation of a second gate layer in the groove, and enabling a reduction of GIDL effect; and form a channel dielectric layer between the first gate layer and the second gate layer, contributing to an increase of the thickness of the gate dielectric layer, further reducing the GIDL effect, and decreasing a contact resistance in an embedded gate. Besides, the channel dielectric layer itself can still maintain the characteristics of a gate, contributing to avoiding a degradation of the characteristics of an embedded transistor.

The description above is merely the preferred implementations of the present invention. It should be noted that the ordinary skills in the art could further make several improvements and embellishments without departing the principle of the present invention, and these improvements and embellishments should also be considered as the scope sought for protection in the present invention.

What is claimed is:

1. A method of forming a semiconductor device, comprising the following steps:
   forming a substrate with a trench, a gate dielectric layer covering an inner wall of the trench, a barrier layer covering a portion of a surface of the gate dielectric layer, and a first gate layer filled on an inner side of the barrier layer being disposed in the trench, wherein the substrate further includes a memory node contact region and a bit-line node contact region, which are located on opposite sides of the trench;
   removing a portion of the barrier layer to form a groove located between the first gate layer and the gate dielectric layer, wherein a bottom surface of the groove is located above a bottom surface of the memory node contact region and a bottom surface of the bit-line node contact region;
   forming a channel dielectric layer at least covering an inner wall of the groove and a top surface of the first gate layer; and
   forming a second gate layer at least partially filling an interior of the groove.

2. The method of forming the semiconductor device according to claim 1, wherein specific steps of forming the substrate comprise:
   providing a substrate with a trench;
   successively forming a gate dielectric layer covering an entire inner wall of the trench, a barrier layer covering an entire surface of the gate dielectric layer, and a first gate layer filled on an overall inner side of the barrier layer; and
   back etching the barrier layer and the first gate layer, such that both of a top surface of the barrier layer and a top surface of the first gate layer are located below a top surface of the trench.

3. The method of forming the semiconductor device according to claim 1, wherein a specific step of removing a portion of the barrier layer comprises:
   etching a portion of the barrier layer by an in-situ process or an ex-situ process.

4. The method of forming the semiconductor device according to claim 1, wherein a specific step of forming a channel dielectric layer at least covering an inner wall of the groove and a top surface of the first gate layer comprises:
   depositing, by an atomic layer deposition process, a channel dielectric layer covering an inner wall of the groove, a top surface of the first gate layer, and a surface of the gate dielectric layer.

5. The method of forming the semiconductor device according to claim 1, wherein the channel dielectric layer has a thickness less than the barrier layer.

6. The method of forming the semiconductor device according to claim 1, wherein the second gate layer is located only in the groove, and a top surface of the second gate layer is located below the top surface of the first gate layer; or
   the second gate layer is located only in the groove, and a top surface of the second gate layer flushes with the top surface of the first gate layer; or
   the groove is filled with the second gate layer and the channel dielectric layer located on the top surface of the first gate layer is covered with the second gate layer.

7. The method of forming the semiconductor device according to claim 1, wherein a material of the channel dielectric layer is one or a combination of an oxide and a nitride.

8. The method of forming the semiconductor device according to claim 1, wherein after the second gate layer at least partially filling the interior of the groove is formed, the method further includes the following step:
   forming a gate overlying layer with which, the trench is filled.

9. The method of forming the semiconductor device according to claim 1, wherein the channel dielectric layer covers an entire inner wall of the groove.

10. A semiconductor device, comprising:
    a substrate with a trench, an inner wall surface of the trench being covered with a gate dielectric layer;
    a barrier layer covering a portion of a surface of the gate dielectric layer, a top surface of the barrier layer being located below a top surface of the gate dielectric layer;
    a first gate layer filled on an inner side of the barrier layer, a top surface of the first gate layer being located below the top surface of the gate dielectric layer and above the top surface of the barrier layer;
    a groove located between the first gate layer and the gate dielectric layer;
    a channel dielectric layer at least covering an inner wall of the groove and the top surface of the first gate layer; and
    a second gate layer at least partially filling an interior of the groove; and,
    wherein the substrate further includes a memory node contact region and a bit-line node contact region, which are located on opposite sides of the trench; and
    a bottom surface of the groove is located above a bottom surface of the memory node contact region and a bottom surface of the bit-line node contact region.

11. The semiconductor device according to claim 10, wherein the channel dielectric layer has a thickness less than the barrier layer.

12. The semiconductor device according to claim 10, wherein the channel dielectric layer has a thickness of 1 Å to 20 Å.

13. The semiconductor device according to claim 10, wherein the second gate layer is located only in the groove, and a top surface of the second gate layer is located below the top surface of the first gate layer; or
    the second gate layer is located only in the groove, and a top surface of the second gate layer is flush with the top surface of the first gate layer; or
    the groove is filled with the second gate layer and a surface of the channel dielectric layer located on the top surface of the first gate layer is covered with the second gate layer.

14. The semiconductor device according to claim 10, wherein a material of the first gate layer is metal, and a material of the second gate layer is polycrystalline silicon.

15. The semiconductor device according to claim 10, wherein a material of the channel dielectric layer is one or a combination of an oxide and a nitride.

16. The semiconductor device according to claim 10, further comprising:
    a gate overlying layer located on the second gate layer and/or the channel dielectric layer.

17. The semiconductor device according to claim 10, wherein the channel dielectric layer covers an entire inner wall of the groove.

18. The semiconductor device according to claim 17, wherein the channel dielectric layer further covers a surface of the gate dielectric layer.

* * * * *